(12) United States Patent
Kim et al.

(10) Patent No.: US 9,837,009 B2
(45) Date of Patent: Dec. 5, 2017

(54) APPARATUS AND METHOD FOR DRIVING DISPLAY PANEL

(71) Applicant: SAMSUNG ELECTRONICS CO., LTD., Suwon-si (KR)

(72) Inventors: Hojung Kim, Suwon-si (KR); Hongseok Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 36 days.

(21) Appl. No.: 14/564,966

(22) Filed: Dec. 9, 2014

(65) Prior Publication Data

US 2015/0161930 A1    Jun. 11, 2015

(30) Foreign Application Priority Data

Dec. 9, 2013  (KR) .................. 10-2013-0152523

(51) Int. Cl.
*G09G 3/36* (2006.01)
*G09G 3/20* (2006.01)
*H01L 27/12* (2006.01)

(52) U.S. Cl.
CPC ............ *G09G 3/20* (2013.01); *G09G 3/3648* (2013.01); *G09G 3/3666* (2013.01); *G09G 3/3677* (2013.01); *H01L 27/124* (2013.01); *G09G 2300/08* (2013.01); *G09G 2310/0205* (2013.01); *G09G 2310/0262* (2013.01); *G09G 2320/0223* (2013.01); *G09G 2320/0252* (2013.01); *H01L 27/1225* (2013.01)

(58) Field of Classification Search
CPC .. G09G 3/36; G09G 5/00; G09G 3/30; G09G 3/28; G06F 3/038
See application file for complete search history.

(56) References Cited

U.S. PATENT DOCUMENTS

| | | | | |
|---|---|---|---|---|
| 4,816,819 A | * | 3/1989 | Enari | G09G 3/3611 345/211 |
| 6,456,267 B1 | * | 9/2002 | Sato | G09G 3/3659 345/204 |
| 7,432,905 B2 | | 10/2008 | Koyama et al. | |
| 7,626,643 B2 | | 12/2009 | Ijzerman et al. | |
| 8,111,465 B2 | | 2/2012 | Heikenfeld et al. | |
| 8,264,772 B2 | | 9/2012 | Javidi et al. | |
| 2007/0146278 A1 | * | 6/2007 | Pan | G09G 3/3659 345/92 |
| 2008/0078993 A1 | * | 4/2008 | Cho | H01L 51/102 257/40 |
| 2009/0219238 A1 | * | 9/2009 | Furuya | G09G 3/006 345/87 |

(Continued)

FOREIGN PATENT DOCUMENTS

| | | |
|---|---|---|
| KR | 10-0780945 B1 | 12/2007 |
| KR | 10-2008-0078361 A | 8/2008 |
| KR | 10-2015-0066901 A | 6/2015 |

*Primary Examiner* — Pegeman Karimi
(74) *Attorney, Agent, or Firm* — Sughrue Mion, PLLC (57) ABSTRACT

An apparatus for driving a display panel including a plurality of cells coupled to a plurality of gate lines and a plurality of data lines, a gate driver configured to output a gate selection signal to a shared gate line, and a data driver configured to output data signals to the cell array. The shared gate line includes a first gate line and a second gate line, the first and second gate lines sharing the gate selection signal.

21 Claims, 10 Drawing Sheets

(56) References Cited

U.S. PATENT DOCUMENTS

| | | | |
|---|---|---|---|
| 2010/0039361 A1* | 2/2010 | Hsu | G09G 3/3677 345/92 |
| 2010/0128019 A1 | 5/2010 | Harada | |
| 2010/0157399 A1 | 6/2010 | Kroll et al. | |
| 2010/0195178 A1 | 8/2010 | Leister et al. | |
| 2011/0084944 A1 | 4/2011 | Bae | |
| 2011/0242150 A1 | 10/2011 | Song et al. | |
| 2012/0086994 A1 | 4/2012 | Choi et al. | |
| 2012/0194638 A1 | 8/2012 | Smalley et al. | |
| 2012/0194885 A1 | 8/2012 | Han et al. | |
| 2012/0299970 A1* | 11/2012 | Bae | G09G 3/3648 345/690 |
| 2013/0002638 A1 | 1/2013 | Missbach | |
| 2013/0201169 A1* | 8/2013 | Ahn | G09G 3/3241 345/211 |
| 2013/0335795 A1 | 12/2013 | Song et al. | |
| 2014/0132724 A1 | 5/2014 | Choi et al. | |
| 2015/0161930 A1 | 6/2015 | Kim et al. | |

\* cited by examiner

APPARATUS AND METHOD FOR DRIVING DISPLAY PANEL

RELATED APPLICATION

This application claims the benefit of Korean Patent Application No. 10-2013-0152523, filed on Dec. 9, 2013, in the Korean Intellectual Property Office, the disclosure of which is incorporated herein by reference in its entirety.

BACKGROUND

1. Field

Methods and apparatuses consistent with exemplary embodiments relate to driving a display panel.

2. Description of Related Art

Various flat panel display devices having reduced weight and size, compared to conventional cathode ray tubes (CRTs) have been developed. Examples of these flat panel display devices include a plasma display panel (PDP), a liquid crystal display (LCD), a field emission display (FED), and an organic light emitting display (OLED). A flat panel display device includes a panel for displaying an image and a display driver integrated circuit (DDI). The DDI receives image information from a host, such as a graphics controller, converts the received image information into image data, and provides the converted image data to the panel.

Various applications, such as a three-dimensional (3D) display and a hologram, as well as high resolution displays, such as Ultra High Definition (UHD) and Super Hi-Vision (SHV) require a large amount of data to be transmitted. The massive data transmission causes a resistor/capacitor (R/C) delay between a gate driver or a data driver and a cell, and increases the number of cells to be driven.

SUMMARY

Provided are methods and apparatuses for driving a display panel adapted to allow high-speed driving by increasing the amount of data that is applied to a cell via a plurality of data lines at a time.

Additional aspects will be set forth in part in the description which follows and, in part, will be apparent from the description, or may be learned by practice of the presented exemplary embodiments.

According to an aspect of an exemplary embodiment, an apparatus for driving a display panel includes a cell array including a plurality of cells, the cell array being coupled to a plurality of gate lines and a plurality of data lines; a gate driver configured to output a gate selection signal to shared gate lines of the plurality of gate lines; and a data driver configured to output data signals to the cell array. The shared gate lines include a first gate line and a second gate line, the first and second gate lines being configured to share the gate selection signal.

The gate driver may include a plurality of gate selection circuits, and a number of the plurality of gate selection circuits may be inversely proportional to a number of the shared gate lines.

The shared gate line may further include a third gate line, and the first, second and third gate lines may be configured to share the gate selection signal.

A first row of the cell array may be disposed along the first gate line, a second row of the cell array may be disposed along the second gate line, and each of the plurality of cells may include an oxide thin-film transistor (TFT).

The first row and the second row may be adjacent each other.

The gate driver may include a first gate driver configured to output a first gate selection signal to a first portion of the cell array and a second gate driver configured to output a second gate selection signal to a second portion of the cell array.

The cell array may be divided into a plurality of sub-cell arrays, and the first and second gate drivers may be disposed between the plurality of sub-cell arrays.

The cell array may be divided into a plurality of sub-cell arrays including a first sub-cell array and a second sub-cell array, and the gate driver may be configured to simultaneously output a gate selection signal via a first sub-cell array shared gate line and a second sub-cell array shared gate line.

The first sub-cell array may be located on a first side of the gate driver and the second sub-cell array may be located on a second side of the gate driver.

At least two lines of the data lines may correspond to each cell, and a number of the data lines corresponding to the each cell may be equal to a number of the shared gate lines.

At least two data lines corresponding to each cell may be stacked in a three-dimensional (3D) configuration.

At least two data lines assigned to each cell may be made of different metals.

According to another aspect of an exemplary embodiment, an apparatus for driving a display panel includes a cell array including a plurality of cells, the cell array being coupled to a plurality of gate lines and a plurality of data lines; a gate driver configured to output gate selection signals to shared gate lines of the plurality of gate lines; and a data driver configured to output data signals to the cell array. A first row and a second row of the cell array are configured to share a common gate line that is one of the shared gate lines and disposed adjacent between the first and second rows of the cell array.

The gate driver may include a first gate driver and a second gate driver, the cell array may be divided into a plurality of sub-cell arrays, and the first gate driver and the second gate driver may be disposed between the plurality of sub-cell arrays.

At least two of the data lines may correspond to each cell of the plurality of cells, and each of the plurality of cells may include an oxide thin-film transistor (TFT).

At least two data lines corresponding to each cell may be stacked in a three-dimensional (3D) configuration.

According to another aspect of an exemplary embodiment, a method of driving a display panel includes outputting a gate selection signal via shared gate lines among a plurality of gate lines, the shared gate lines being configured to share the gate selection signal; and outputting data signals to a cell array, each cell of the cell array being assigned with plural data lines, a number of the plural data lines being same as a number of the shared gate lines.

In the outputting of the gate selection signal, the gate selection signal may be simultaneously output via the shared gate lines.

In the outputting of the gate selection signal, the gate selection signal may be output by gate selection circuits, and a number of the gate selection circuits may be inversely proportional to the number of the shared gate lines.

At least two gate lines may be shared.

The gate selection signal may be applied to a gate electrode of an oxide thin-film transistor (TFT).

BRIEF DESCRIPTION OF THE DRAWINGS

These and/or other aspects will become apparent and more readily appreciated from the following description of certain exemplary embodiments, taken in conjunction with the accompanying drawings in which.

DETAILED DESCRIPTION

The following detailed description is provided to assist the reader in gaining a comprehensive understanding of the methods, apparatuses, and/or systems described herein. Various embodiments are illustrated in the drawings and described in detail. However, this is not intended to limit the present invention to a particular mode of practice, and it is to be appreciated that the present invention encompasses all changes, equivalents, and substitutes within the spirit and technical scope thereof. In the present disclosure, well-known methods will not be described in detail so as not to unnecessarily obscure the essence of the present disclosure.

While terms, such as "first" and "second" may be used to describe various components, such components must not be limited to the above terms. The terms are used only to distinguish one component from another.

All terms used herein are merely used to describe exemplary embodiments, and are not intended to limit the present invention. Use of singular forms includes plural references as well unless expressly specified otherwise. The terms "comprising", "including", and "having" specify the presence of stated features, numbers, steps, operations, elements, components, and/or a combination thereof but do not preclude the presence or addition of one or more other features, numbers, steps, operations, elements, components, and/or a combination thereof. Expressions such as "at least one of," when preceding a list of elements, modify the entire list of elements and do not modify the individual elements of the list.

One or more exemplary embodiments will now be described more fully with reference to the accompanying drawings. In the drawings, reference numerals refer to like elements throughout, and repeated descriptions thereof are omitted here.

Figure 1:
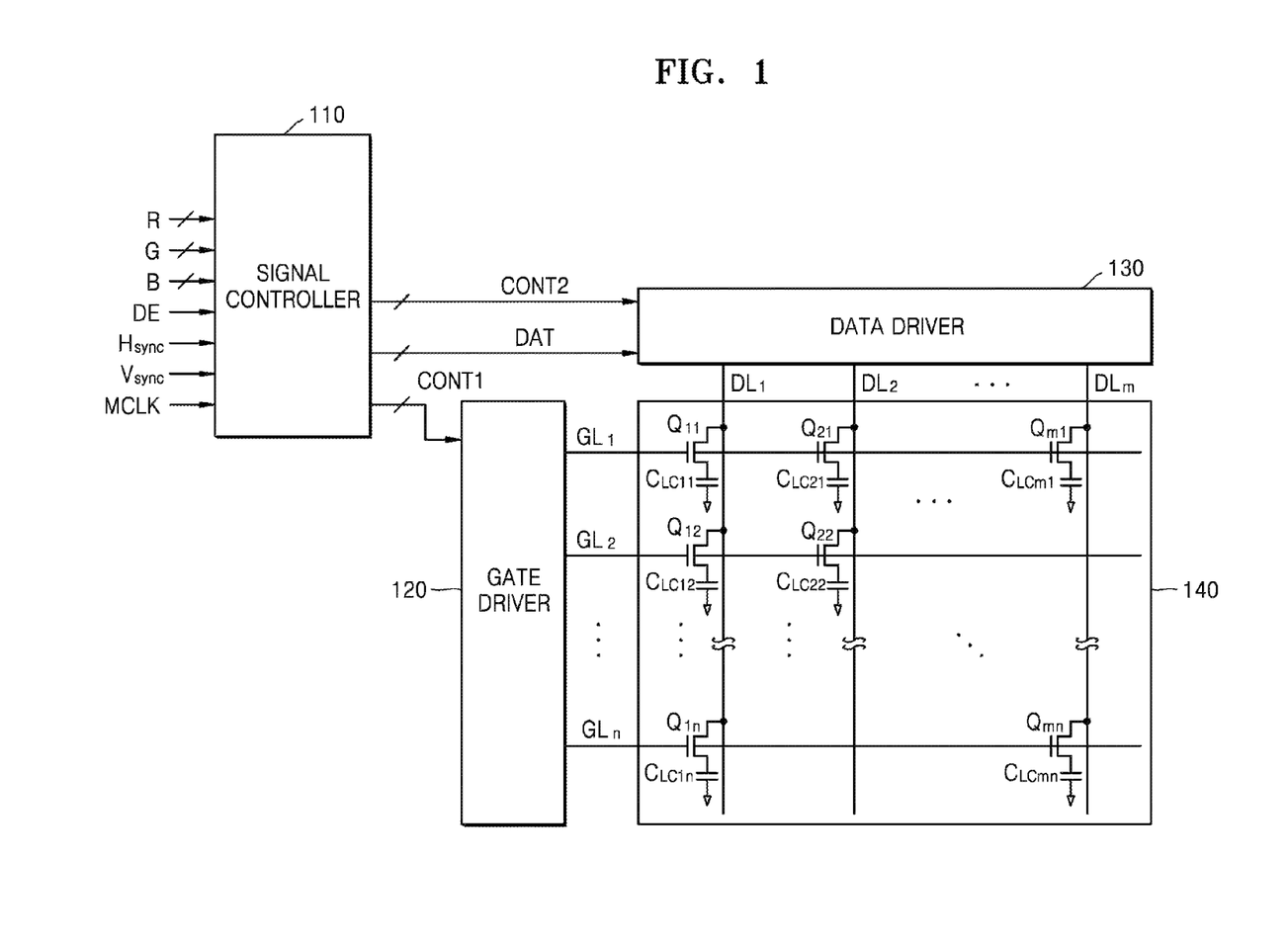
FIG. 1 is a schematic diagram of an apparatus for driving a display panel.

FIG. 1 is a schematic diagram of an apparatus which drives a display panel 140.

As shown in FIG. 1, the apparatus for driving the display panel 140 includes a signal controller 110, a gate driver 120, a data driver 130, and the display panel 140. The display panel 140 includes a plurality pixels arranged in a matrix form. As illustrated in FIG. 1, a plurality of n gate lines, GL1 through GLn, extend in a first direction, and a plurality of m data lines, DL1 through DLm, extend in a second direction that is substantially perpendicular to the first direction.

A circuit for each pixel includes a thin-film transistor (one of $Q_{11}$ through $Q_{mn}$) and a liquid crystal capacitor (one of $C_{LC11}$ through $C_{LCMN}$) connected to the thin-film transistor. Although not shown, the circuit may further include storage capacitors $C_{ST}$ corresponding to the liquid crystal capacitors $C_{LC11}$ through $C_{LCMN}$.

The signal controller 110 may receive input image signals and input control signals from an external graphics controller. The input image signals represent three colors, i.e., red (R), green (G), and blue (B), and the input control signals control display of the image signals. The input control signals include a vertical synchronization signal, Vsync, a horizontal synchronization signal, Hsync, a main clock, MCLK, a data enable signal, DE, etc. The signal controller 110 may process image signals based on the input image signals R, G, B, and the input control signals. The signal controller 110 may generate control signals, such as gate control signal CONT1 and data control signal CONT2. After generating the control signals, the signal controller 110 also outputs the gate control signals CONT1 to the gate driver 120. The signal controller 110 further outputs the data control signals CONT2 and the processed image data DAT to the data driver 130.

The gate control signal CONT1 may include a gate line control signal, a clock signal, and an output enable signal for defining the duration of a gate-on state. The gate line control signal sequentially enables (or activates) the plurality of n gate lines, GL1 through GLn. The output enable signal defines the duration in which a gate is in on-state.

The data control signal CONT2 includes a horizontal synchronization signal, Hsync, a load signal and a data clock signal. The horizontal synchronization signal Hsync notifies a start of an input of image data DAT. The load signal directs data voltages to be applied to corresponding data lines DL1 through DLm.

The data driver 130 may sequentially receive image data DAT from the signal controller 110, according to the data control signal CONT2, to display one row of pixels. The data driver 130 may apply a gray-scale voltage corresponding to the input image data DAT to a corresponding data line.

The gate driver 120 may sequentially generate gate line driving signals according to the gate control signal CONT1, received from the signal controller 110. The gate line driving signal may drive n gate lines GL1 through GLn. The gate driver 120 may output the gate line driving signals to corresponding gate lines.

Applications, such as a three-dimensional (3D) display, a hologram, as well as high resolution displays, including Ultra High Definition (UHD) and Super Hi-Vision (SHV), require a large amount of image data to be transmitted to a screen. Employing a conventional apparatus for driving the display panel 140 for those applications may cause a resistor-capacitor (RC) delay between the gate driver 120 or data driver 130 and a cell, and may not work properly due to significantly increased number of cells to be driven (for examples, 4096×2160 pixels in UHD and 7680×4320 pixels in SHV).

Figure 2:
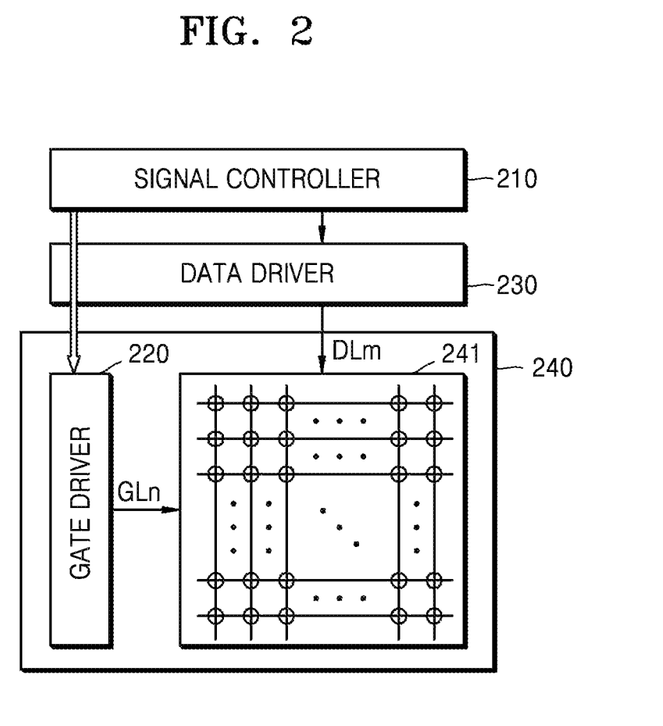
FIG. 2 is a schematic diagram of an apparatus for driving a display panel according to an exemplary embodiment.

FIG. 2 is a schematic diagram illustrating an apparatus driving a display panel 240 according to an aspect of an exemplary embodiment.

As shown in FIG. 2, a gate driver 220 is mounted in the display panel 240 together with a cell array 241. A signal controller 210 outputs a gate control signal to the gate driver 220 in the display panel 240. Transistors used in the gate driver 220, and cell transistors of each cell in the cell array 241, may be oxide thin-film transistors (TFTs). An oxide TFT has a high mobility, and thus is suitable for high-speed driving of a large-screen. An RC delay may be minimized by dividing the number of cells for driving into sections. Switching delay, in response to a gate selection signal, may be reduced with oxide TFTs. Therefore, a large amount of image data may be displayed by simultaneously activating cells disposed along a plurality of gate lines, and outputting data signals via a plurality of data lines, to drive corresponding cells. The gate driver 220 may output a gate selection signal GLn to the cell array 241, and the data driver 230 may output a data signal DLm to cells selected in response to the gate selection signal GLn.

Figure 3:
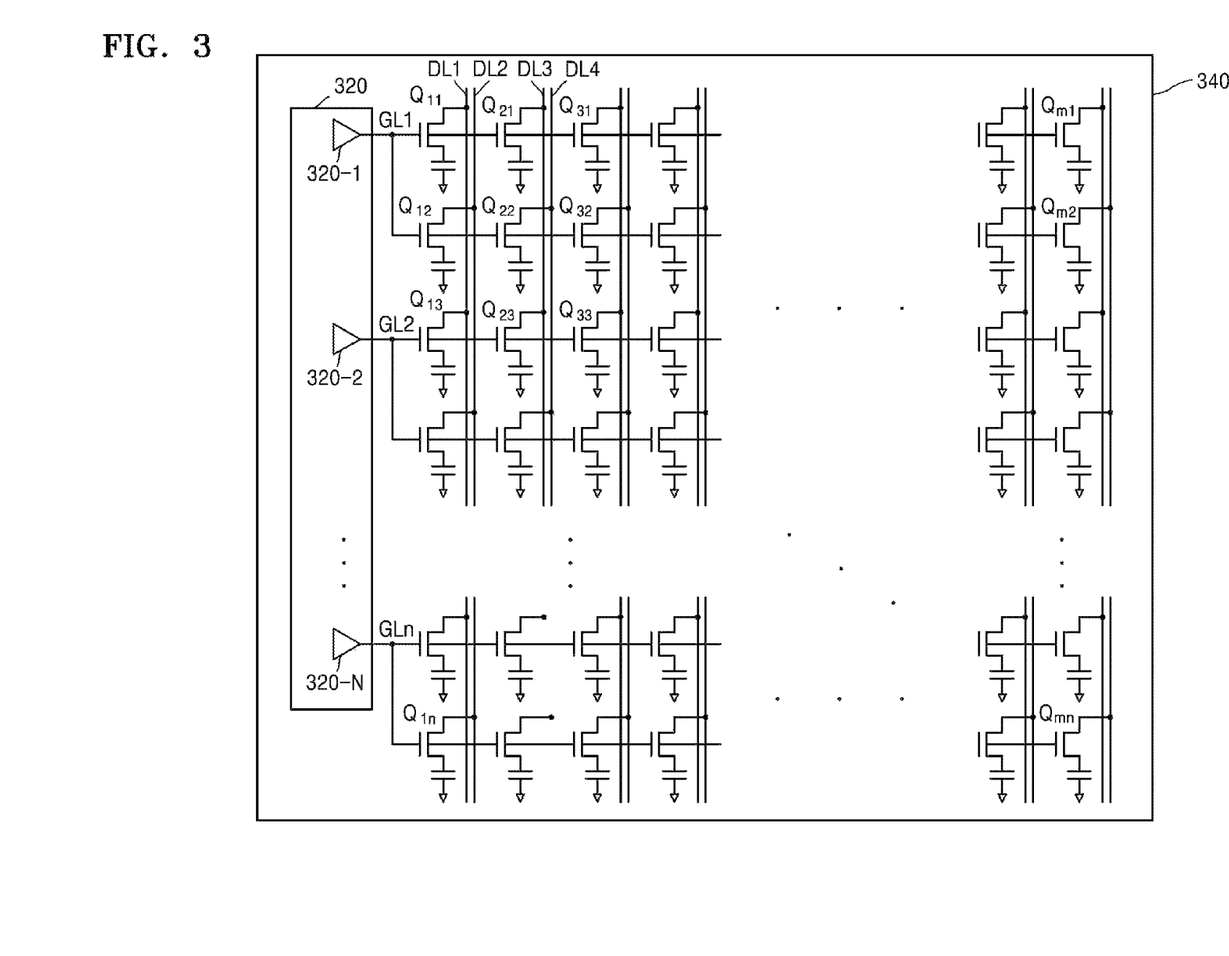
FIGS. 3 and 4 are schematic diagrams of an apparatus for driving a display panel according to an exemplary embodiment.
Figure 4:
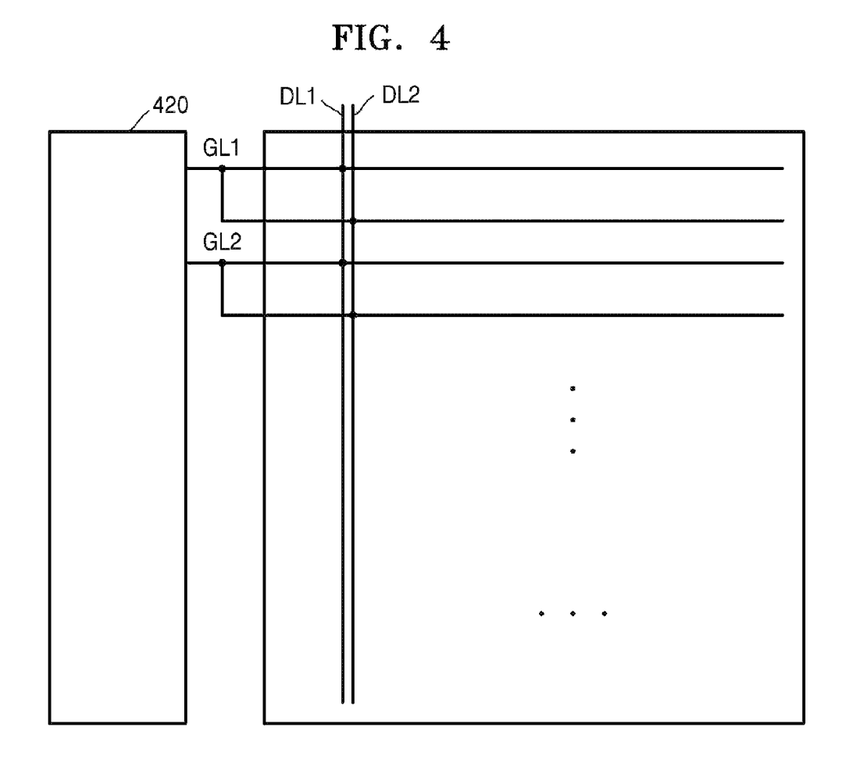

FIGS. 3 and 4 are schematic diagrams of an apparatus driving a display panel according to an aspect of an exemplary embodiment.

As shown in FIG. 3, a gate driver 320, of display panel 340, may output a gate selection signal GL1 to two rows of gate lines in a cell array. First and second gate lines are connected to the cells in first and second rows, and may be configured to share the same gate selection signal, GL1. In the same way, third and fourth gate lines are connected to the cells in third and fourth rows, and may also be configured to share the same gate selections signal. The gate driver 320 includes gate selection circuits 320-1, 320-2 and 320-N. Although FIG. 3 illustrates that the gate driver 320 includes only three gate selection circuits, 320-1, 320-2 and an additional gate selection circuit with an arbitrary number "N", the number of gate selection circuits may not be limited thereto. The gate driver 320 may further include one or more of a decoder, a common level shifter, and a gate operation circuit. However, aspects of exemplary embodiments are described mainly with respect to a configuration in which the gate driver 320 receives an address signal and outputs individual gate selection signals for each gate line, thereby selectively conducting oxide TFTs connected to the each gate line. The address signal may be used to select the gate lines, among n gate lines, to which a corresponding gate selection signal is output.

The gate selection circuit 320-1 may output the gate selection signal GL1 to the gate lines in the first and second rows of the cell array. The gate selection signal GL1 may be applied to a gate electrode of the first oxide TFT $Q_{11}$ in the first row, and a gate electrode of the first oxide TFT $Q_{12}$ in the second row, thereby turning them on. Similarly, the gate selection signal GL1 turns on the remaining oxide TFTs ($Q_{21}$ to $Q_{m1}$) arranged in the first row, as well as the remaining oxide TFTs ($Q_{22}$ to $Q_{m2}$) arranged in the second row.

When two gate lines are configured to share the same gate selection signal, as shown in FIG. 3, two data lines are arranged in a first column of the cell array. Therefore, each cell of the cell array is assigned two data lines. Referring to FIG. 3, a first data line DL1 is coupled to an electrode (e.g., a source electrode) of a first oxide TFT $Q_{11}$ in the first row, and a second data line DL2 is coupled to an electrode (e.g., a source electrode) of a first oxide TFT $Q_{21}$ in the second row. First oxide TFTs ($Q_{11}$ in the first and second rows may be simultaneously turned on by the same gate selection signal, GL1, output from the gate selection circuit 320-1. The data driver 230, as shown in FIG. 2, may output data signals to electrodes of the first oxide TFTs ($Q_{11}$ in the first row through the first data line DL1, and second row through the second data line DL2, respectively. Similarly, to turn on a second oxide TFT $Q_{21}$ in the first row, the data driver 230 may output a data signal to an electrode of the second oxide TFT $Q_{21}$ in the first row through a third data line DL3. A second TFT $Q_{22}$ in the second row may be turned on simultaneously when the data driver 230 outputs a data signal to an electrode of the second oxide TFT $Q_{22}$ through a fourth data line DL4. The cells arranged along the gate lines (i.e., the first and second rows in FIG. 3) that are configured to be shared are addressed by one gate selection signal GL1 from the gate selection circuit 320-1. The cells (e.g., $Q_{11}$, $Q_{12}$) in the same column and coupled to shared gate lines may be addressed simultaneously by using two data lines (e.g., DL1, DL2) assigned to each cell. It is also possible to output driving signals to selected cell arrays through the two data lines assigned to each cell. Therefore, this configuration may operate a large number of cells at the same time, and thus is suitable for driving a large display and driving a display at a high speed.

FIG. 4 illustrates an exemplary arrangement of gate selection circuit 420, gate lines GL1 and GL2, and data lines DL1 and DL2 of the apparatus shown in FIG. 3. Although FIG. 4 illustrates gate lines in adjacent two rows as being shared, this is not meant to be limiting, and other various configurations are possible, such as sharing gate lines in odd or even numbered rows. As shown in FIG. 4, the number of data lines assigned to each cell in a column direction is equal to the number of shared gate lines. Therefore, when two gate lines in different rows are configured to share the same gate selection signal, two data lines may be assigned to each cell in a column direction.

Figure 5:
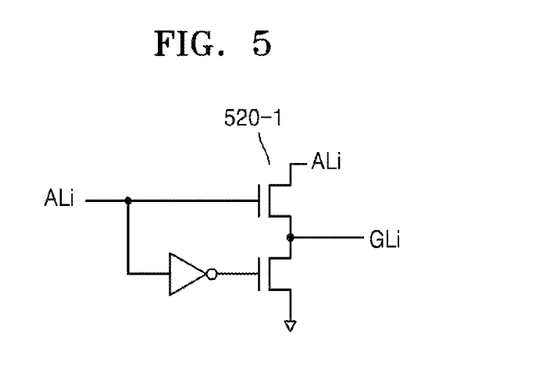
FIG. 5 is a circuit diagram of a gate selection circuit according to an exemplary embodiment.

FIG. 5 is a circuit diagram of a gate selection circuit according to an aspect of an exemplary embodiment.

As shown in FIG. 5, the gate selection circuit 520-1 may include two transistors and one inverter. The gate selection circuit 520-1 may be configured to output a gate selection signal GLi. The two transistors may be oxide TFTs of the same type (e.g., N-type). The two transistors may be implemented in a half bridge configuration. The inverter is configured to invert a logical signal ALi. The inverted logical signal may be input to one of the two transistors. Although the illustrated gate selection circuit 520-1 includes the same type of transistors in a half bridge configuration and the inverter, the present disclosure is not limited thereto. The gate selection circuit 520-1 may have transistors of different types (e.g., N-type and P-type) configured in a half bridge. Furthermore, the gate selection circuit 520-1 may be implemented in various other configurations.

Figure 6:
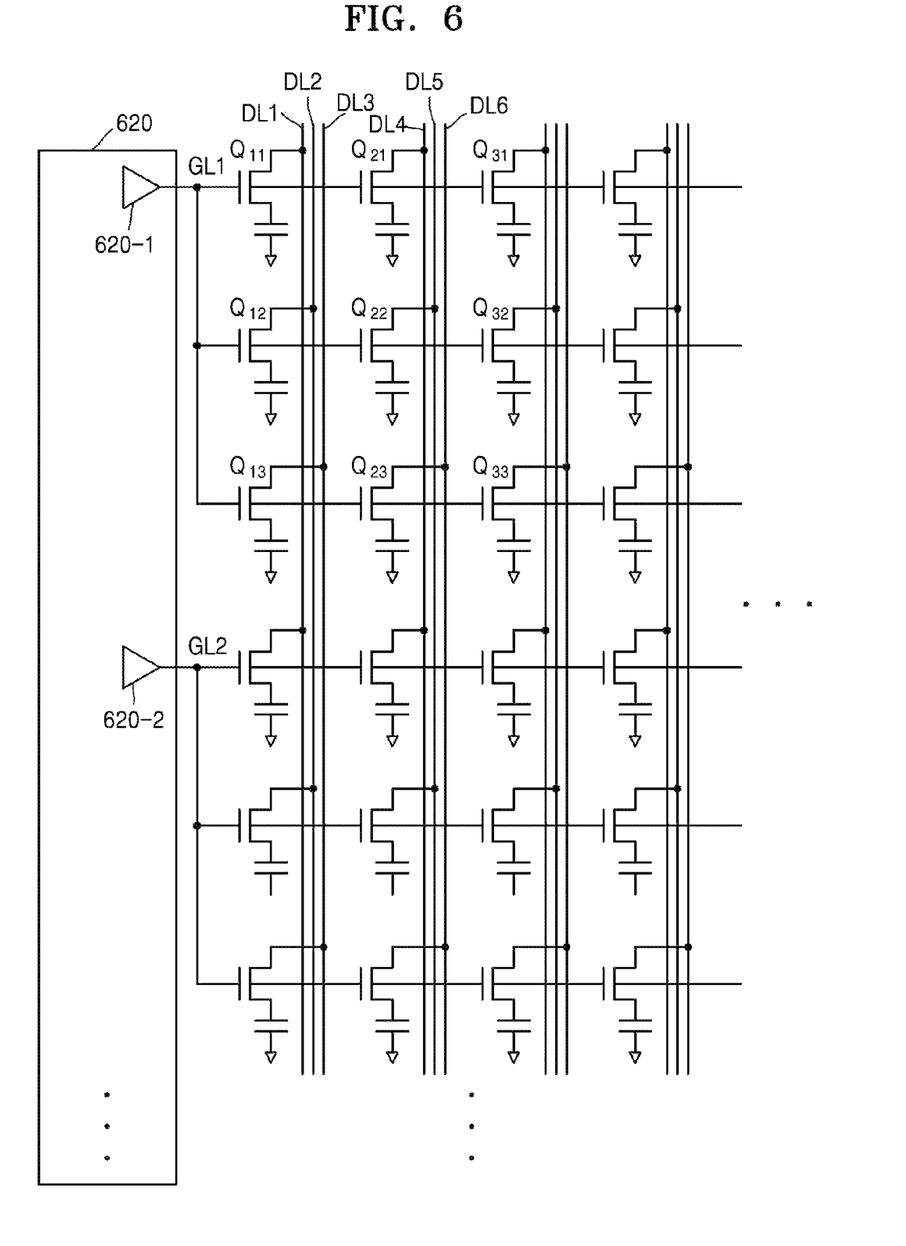
FIG. 6 is a schematic diagram of an apparatus for driving a display panel according to an exemplary embodiment.

FIG. 6 is a schematic diagram of an apparatus for driving a display panel according to an aspect of an exemplary embodiment.

As shown in FIG. 6, a gate driver 620 may be configured to output a gate selection signal GL1 to three rows of cell arrays. Gate lines connected to the cells in first, second and third rows may be configured to share the gate selection signal GL1. Similarly, gate lines connected to the cells in fourth, fifth and sixth rows share gate selection signal GL2. As shown in FIG. 6, the gate driver 620 may include gate selection circuits 620-1 and 620-2.

The gate selection circuit 620-1 may output the gate selection signal GL1 to the gate lines in the first, second and third rows of the cell array. The gate selection signal GL1 may be applied to gate electrodes of oxide TFTs respectively arranged in the first, second and third rows. The first oxide TFTs $Q_{11}$, $Q_{12}$, and $Q_{13}$, respectively in the first, second and third rows, may be turned on by the gate selection signal GL1. Similarly, the remaining oxide TFTs arranged in the first, second and third rows may be turned on together by the gate selection signal GL1.

When a gate line is shared by three rows of cell arrays, as shown in FIG. 6, three data lines are arranged in a first column of a cell array. Therefore, three data lines are assigned to each cell. According to an aspect of an exemplary embodiment, a first data line, DL1, is coupled to one electrode (e.g., a source electrode) of a first oxide TFT $Q_{11}$ in the first row, a second data line, DL2, is coupled to one electrode (e.g., a source electrode) of a first oxide TFT $Q_{12}$ in the second row, and a third data line, DL3, is coupled to one electrode (e.g., a source electrode) of a first oxide TFT $Q_{13}$ in the third row. Therefore, the first oxide TFTs ($Q_{11}$, $Q_{12}$, $Q_{13}$) in the first through third rows may be simultaneously turned on by the gate selection signal GL1 output from the gate selection circuit 620-1. The data driver outputs data signals to the electrodes of the first oxide TFTs ($Q_{11}$, $Q_{12}$, $Q_{13}$) through the first, second and third data lines DL1, DL2 and DL3, respectively. Similarly, when a second oxide TFT $Q_{21}$ in the first row is turned on, the data driver 230 outputs a data signal to an electrode of the second oxide TFT $Q_{21}$ through a fourth data line DL4. When a second TFT $Q_{22}$ in the second row is turned on, the data driver 230 outputs a data signal to an electrode of the second oxide TFT $Q_{22}$ through a fifth data line DL5. The cell arrays arranged along the gate lines in the first through third rows may be shared, as shown in FIG. 6, and addressed by one gate selection signal, GL1, from the gate selection circuit 620-1. The cells (e.g., $Q_{11}$, $Q_{12}$, $Q_{13}$) in the same column and coupled to shared gate lines may be addressed simultaneously by using three data lines (e.g. DL1, DL2, DL3) assigned to each cell. It is also possible to output driving signals to selected cell arrays through the three data lines assigned to each cell. Therefore, a large number of cells may operate simultaneously.

According to aspects of exemplary embodiments, shown in FIGS. 3 and 6, the number of data lines assigned to each cell (i.e., 2 in FIGS. 3 and 3 in FIG. 6) may vary according to the number of gate lines (i.e. 2 in FIGS. 3 and 3 in FIG. 6) configured to share a gate selection signal. The coupling configuration of cell transistors and the data lines described above are based on the exemplary embodiments shown in FIGS. 3 and 6. However, various changes may be made according to applications and characteristics of a display panel.

Figure 7:
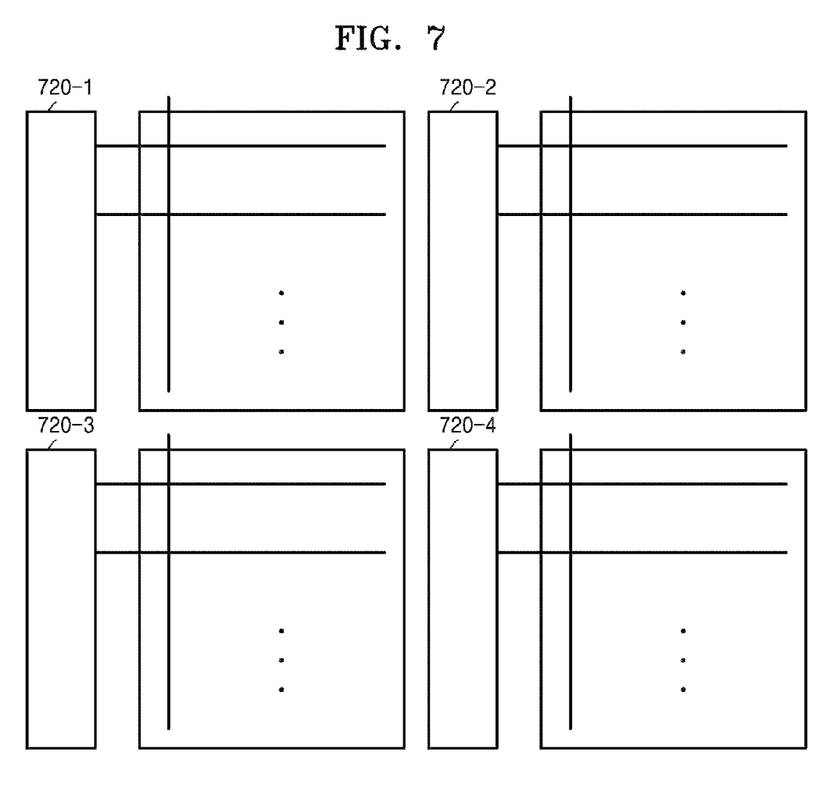
FIG. 7 is a diagram of a multi-gate driver.

FIG. 7 is an exemplary diagram of a multi-gate driver.

As shown in FIG. 7, a cell array is divided into a plurality of sub-cell arrays having a predetermined size. A plurality of gate drivers (720-1 through 720-4) may output gate selection signals to a respective one of the plurality of sub-cell arrays. When the cell array is divided into small sub-cell arrays for driving, the area for each gate driver (720-1, 720-2, 720-3 or 720-4) may be reduced. However, one gate driver (720-1, 720-2, 720-3, or 720-4) still addresses all n rows of a corresponding sub-cell array.

Figure 8:
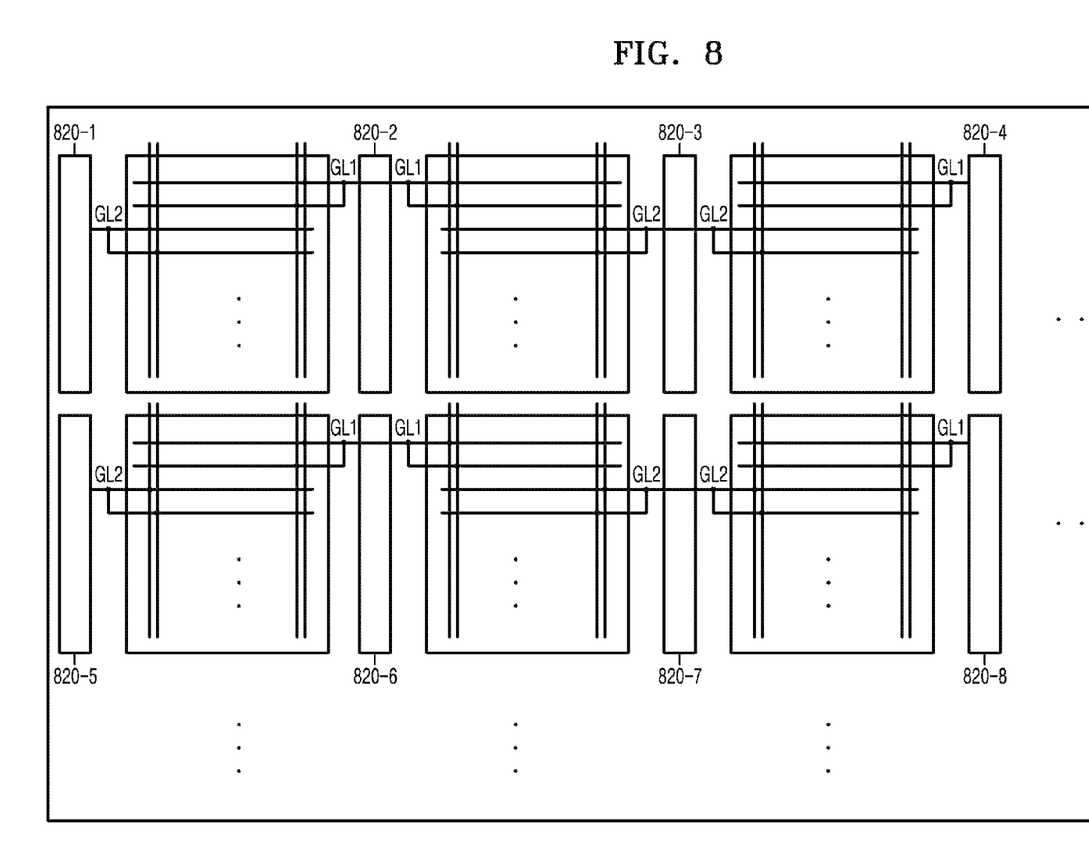
FIG. 8 is a schematic diagram of an apparatus driving a display panel according to an exemplary embodiment.

FIG. 8 is a schematic diagram of an apparatus which drives a display panel according to an aspect of an exemplary embodiment.

FIG. 8 shows first through eighth gate drivers (820-1 through 820-8) and sub-cell arrays that are respectively driven by the first through eighth gate drivers (820-1 through 820-8).

As shown in FIG. 8, the first gate driver 820-1 may output a gate selection signal GL2 through gate lines arranged in third and fourth rows of a first sub-cell array. The gate selection signal GL2 is applied to gate electrodes of transistors (for example, oxide TFTs) in the cells arranged in the third and fourth rows, thereby turning on the oxide TFTs. Then, data signals may be output through two data lines arranged in column direction.

As shown in FIG. 8, the second gate driver 820-2 may simultaneously output a gate selection signal GL1 to first and second rows of the sub-cell arrays disposed on left and right sides of the second gate driver 820-2. The gate selection signal GL1 may be applied to gate electrodes of oxide TFTs in the cells arranged in the first and second rows of the sub-cell arrays, and turn on the oxide TFTs. Then, data signals may be output through two data lines of the left sub-cell array and two data lines of the right sub-cell array.

The third gate driver 820-3 may simultaneously output a gate selection signal GL2 to third and fourth rows of sub-cell arrays disposed on left and right sides of the third gate driver 820-3. The gate selection signal GL1 may be applied to gate electrodes of oxide TFTs in the cells arranged in the third and fourth rows of the sub-cell arrays, thereby turning on the oxide TFTs. Then, data signals may be output through two data lines of the left sub-cell array and two data lines of the right sub-cell array.

Each of the first through eighth gate drivers (820-1 through 820-8) may drive about half of the rows (i.e., n/2) in a corresponding sub-cell array. In addition, each of the gate drivers may simultaneously drive cell arrays disposed in the left side sub-cell array and right side sub-cell array. Therefore, the area of a gate driver within a display panel may be reduced. Furthermore, as shown in FIG. 8, the apparatus may be configured to simultaneously select two cell rows from each of the left and right sub-cell arrays (i.e., total four rows of cell array), and simultaneously output data signals through two data lines in each of the left and right sub-cell arrays (i.e. total four data lines). This may allow a high-speed driving of a display panel.

Figure 9:
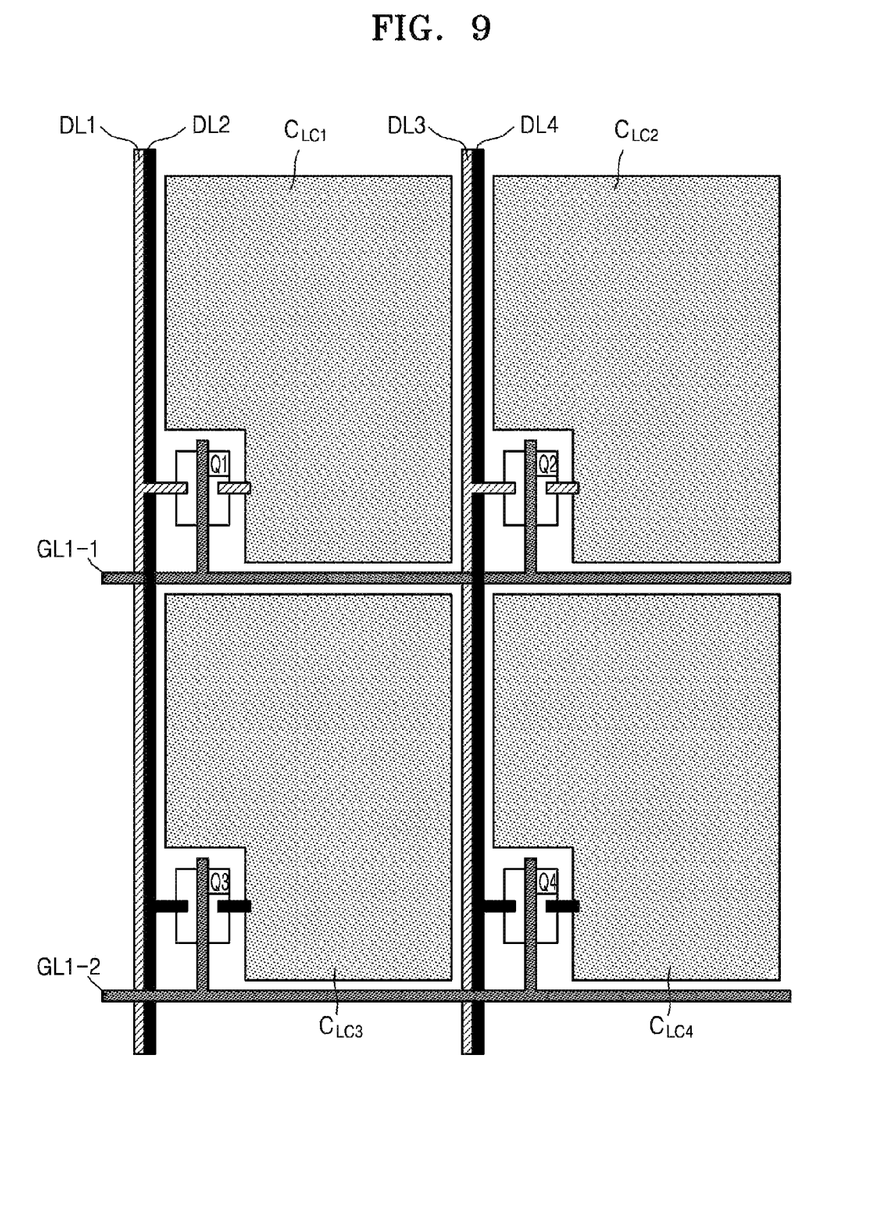
FIG. 9 is a diagram of a display panel according to an exemplary embodiment.

FIG. 9 is a diagram of a display panel according to an aspect of an exemplary embodiment.

According to an aspect of an exemplary embodiment shown in FIG. 9, the display panel includes four cells. Each cell includes one of four transistors, Q1, Q2, Q3, Q4, and one of four liquid crystal capacitors, $C_{LC1}$, $C_{LC2}$, $C_{LC3}$, $C_{LC4}$. The display panel further includes first and second gate lines GL1-1 and GL1-2 arranged in a horizontal direction, and two pairs of data lines arranged in a vertical direction. One of the two pairs of data lines includes first and second data lines DL1 and DL2, and the other pair includes third and fourth data lines DL3 and DL4.

As shown in FIG. 9, each cell, Q1, Q2, Q3, Q4, may be arranged adjacent to a pair of data lines, DL1 and DL2 or DL3 and DL4. Although it is not shown, the first and second gate lines GL1-1 and GL1-2 are shared. Therefore, a gate selection signal may be simultaneously applied to the transistors in first (Q1, Q2) and second (Q3, Q4) rows by the first and second gate lines, GL1-1, GL1-2. The first through fourth transistors, Q1, Q2, Q3, Q4, may be turned on simultaneously in response to the gate selection signal. Then, first data signal may be applied via the first data line DL1 to the first transistor Q1, and second data signal may be applied via the second data line DL2 to the third transistor Q3. Similarly, third data signal may be applied via the third data line DL3 to the third transistor Q3, and fourth data signal may be applied via the fourth data line (DL4) to the fourth transistor Q4.

As shown in FIG. 9, a pair of data lines (e.g., DL1 and DL2) may be arranged adjacent to a cell (e.g., Q1, Q3). According to an aspect of an exemplary embodiment, paired data lines (DL1 and DL2) may be made of different metals. Furthermore, as shown in FIG. 9, the paired data lines (e.g., DL1 and DL2) may be stacked in a 3D configuration, thus minimizing the area thereof. For example, the first gate line GL1-1 may be disposed on the first data line DL1 in a horizontal direction, and the second data line DL2 may be disposed on the first gate line GL1-1. Thus, a space of interconnections may be minimized without affecting a cell area.

Figure 10:
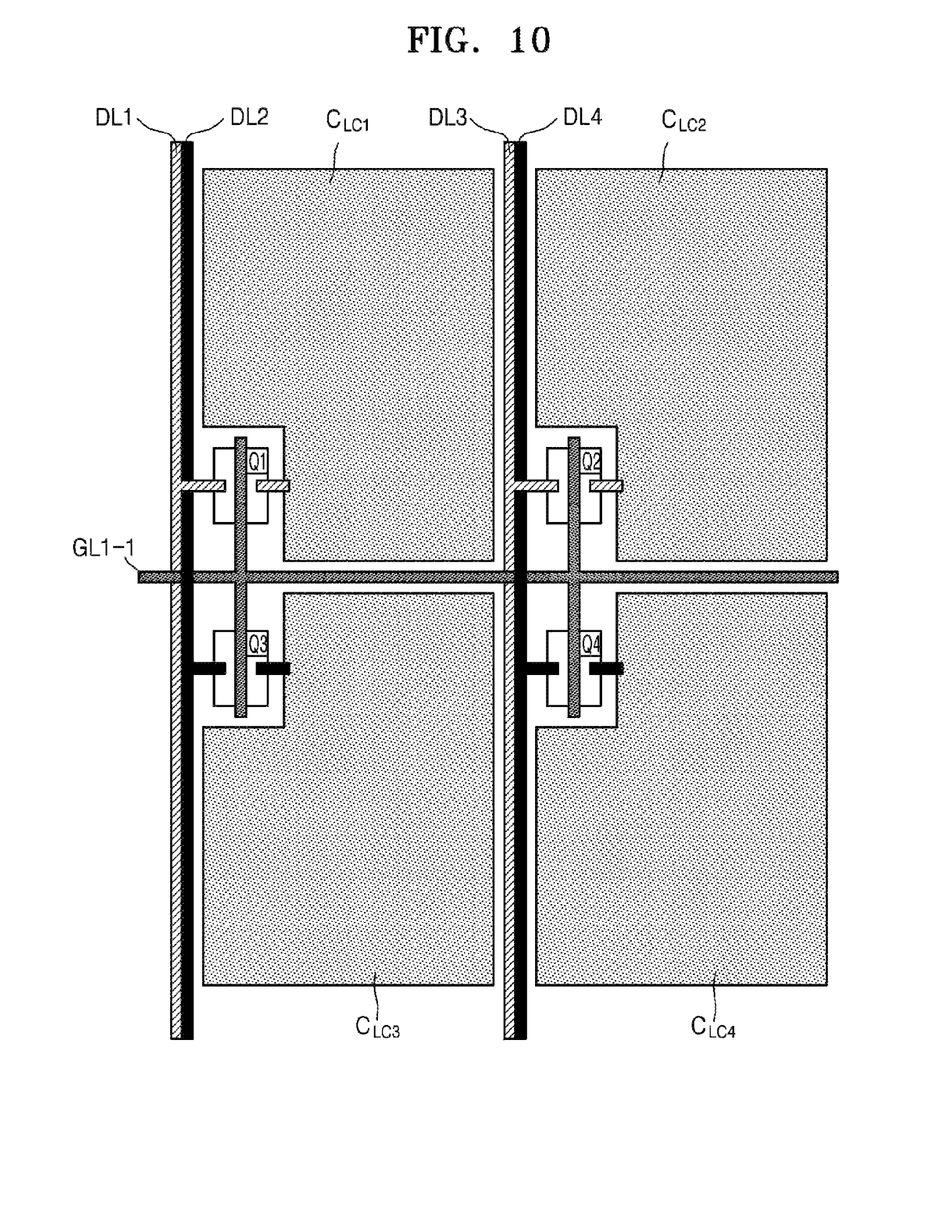
FIG. 10 is a diagram of a display panel according to an exemplary embodiment.

FIG. 10 is a diagram illustrating a layout of a display panel according to an aspect of an exemplary embodiment.

As shown in FIG. 10, the display panel may include four cells. Each cell includes one of first through fourth transistors, Q1, Q2, Q3, Q4, and one of liquid crystal capacitors, $C_{LC1}$, $C_{LC2}$, $C_{LC3}$, $C_{LC4}$. The display panel further includes one gate line, GL1-1, disposed in a horizontal direction, and two pairs of data lines arranged in a vertical direction. One of the two pairs of data lines includes first and second data lines, DL1 and DL2, and the other pair includes third and fourth data lines, DL3 and DL4.

First through fourth transistors, Q1, Q2, Q3 and Q4, may be turned on simultaneously through the single gate line GL1-1. As described above, the gate line GL1-1 may be commonly shared by the first through fourth transistors. Therefore, when a gate selection signal is applied to the common gate line GL1-1, the first through fourth transistors may be simultaneously turned on. In response to the gate selection signal, the four cells may be simultaneously selected as well. Then, first and second data signals may be applied to the first and third transistors, Q1 and Q3, via the first and second data lines, DL1 and DL2, respectively. Similarly, third and fourth data signals may be applied to the second and fourth transistors, Q2 and Q4, via the third and fourth data lines, DL3 and DL4, respectively.

As shown in FIG. 10, a single common gate line may be disposed between adjacent rows of cells. The cells arranged adjacent to the single common gate line may be selected together, and data signals may be output to the selected cells through a plurality of data lines.

According to an aspect of an exemplary embodiment, a second common gate line GL1-2 may be placed between adjacent rows of cells in a similar manner to that shown in FIG. 10. The first and second common gate lines (GL1-1, GL1-2) may be configured to share a gate selection signal. Then, the four rows of cell arrays may be selected by the single gate selection signal. In this case, four data lines may be assigned to each cell, and four data signals may be output to selected cells via the four data lines in a column direction.

Figure 11:
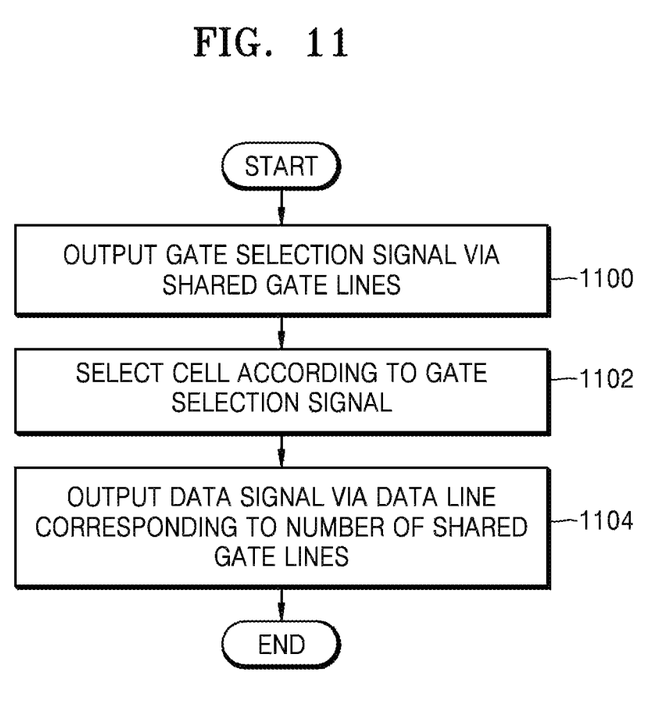
FIG. 11 is a flowchart illustrating a method of driving a display panel according to an exemplary embodiment.

FIG. 11 is a flowchart illustrating a method of driving a display panel according to an aspect of an exemplary embodiment.

As shown in FIG. 11, a gate selection signal may be output via shared gate lines (Operation 1100). Sharing may be implemented in such a way that a gate selection signal is applied to gate electrodes of two or more cell transistors. For example, applying one gate selection signal to first and second gate lines, as shown in FIG. 9, or to a single common gate line, as shown in FIG. 10.

Cells to be driven are selected according to a gate selection signal (Operation 1102). Cells (i.e., cells or cell arrays corresponding to the number of shared gate lines) sharing gate lines may be simultaneously selected according to the gate selection signal.

Data signals may be output via the data lines where the number of data lines is equal to the number of the shared gate lines (Operation 1104). For example, when two gate lines are shared, data signals may be output via two data lines. If three gate lines are shared, data signals may be output via three data lines.

As described above, methods of driving a display panel consistent with the one or more of the above exemplary embodiments may reduce an RC delay by using an oxide TFT as a cell transistor, and dividing a cell array into smaller sub-cell arrays for driving. The methods also may allow high-speed driving by increasing the amount of data that is simultaneously applied to a cell array through a plurality of data lines. Therefore, the methods may be applied to a panel or a driver IC that requires high-speed operation, and are suitable for large-screen and high-resolution displays, such as UHD, SHV, and hologram.

The particular implementations shown and described herein are illustrative examples, and are not intended to otherwise limit the scope in any way. For the sake of brevity, conventional electronics, control systems, software development and other functional aspects of the systems may not be described in detail. Furthermore, the connecting lines or connectors shown in the various figures presented are intended to represent exemplary functional relationships and/or physical or logical couplings between the various elements. It should be noted that many alternative or additional functional relationships, physical connections or logical connections may be consistent with the present disclosure. Moreover, no item or component is essential to the practice of the disclosure unless the element is specifically described as "essential" or "critical."

The use of the term "the" and similar referents in the context of describing the exemplary embodiments (especially in the context of the following claims) are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the operations described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. While the present general inventive concept has been particularly shown and described with reference to exemplary embodiments thereof, it will be understood by those of ordinary skill in the art that various changes, combinations, and modifications in form and details may be made therein according to design conditions and factors without departing from the spirit and scope of the present general inventive concept as defined by the following claims including equivalents thereof.

What is claimed is:

1. An apparatus for driving a display panel, the apparatus comprising:
    a cell array comprising a plurality of cells coupled to a plurality of gate lines and a plurality of data lines;
    a gate driver configured to output a gate selection signal to a shared gate line of the plurality of gate lines; and
    a data driver configured to output data signals to the cell array via a plurality of data lines,
    wherein the shared gate line comprises a first gate line and a second gate line, the first and second gate lines being configured to share the gate selection signal,
    the gate selection signal is simultaneously applied to cells connected to the first gate line and cells connected to the second gate line such that the gate selection signal applied to the cells connected to the first gate line and the gate selection signal applied to the cells connected to the second gate line have a same polarity, and
    a number of the plurality of data lines is equal to a number of cells connected to the shared gate line.

2. The apparatus of claim 1, wherein the gate driver comprises a plurality of gate selection circuits, and a number of the plurality of gate selection circuits is inversely proportional to a number of the shared gate lines.

3. The apparatus of claim 1, wherein the shared gate line further comprises a third gate line, and
wherein the first, second and third gate lines are configured to share the gate selection signal.

4. The apparatus of claim 1, wherein a first row of the cell array is disposed along the first gate line, a second row of the cell array is disposed along the second gate line, and each of the plurality of cells comprises an oxide thin-film transistor (TFT).

5. The apparatus of claim 4, wherein the first row and the second row are adjacent each other.

6. The apparatus of claim 1, wherein the gate driver includes a first gate driver configured to output a first gate selection signal to a first portion of the cell array and a second gate driver configured to output a second gate selection signal to a second portion of the cell array.

7. The apparatus of claim 6, wherein the cell array is divided into a plurality of sub-cell arrays, and the first and second gate drivers are disposed between the plurality of sub-cell arrays.

8. The apparatus of claim 1, wherein the cell array is divided into a plurality of sub-cell arrays comprising a first sub-cell array and a second sub-cell array, and
wherein the gate driver is configured to simultaneously output a gate selection signal via a first sub-cell array shared gate line and a second sub-cell array shared gate line.

9. The apparatus of claim 8, wherein the first sub-cell array is located on a first side of the gate driver and the second sub-cell array is located on a second side of the gate driver.

10. The apparatus of claim 1, wherein at least two lines of the data lines correspond to each cell, and a number of the data lines corresponding to the each cell is equal to a number of the shared gate lines.

11. The apparatus of claim 10, wherein the at least two data lines corresponding to each cell are stacked in a three-dimensional (3D) configuration.

12. The apparatus of claim 10, wherein the at least two data lines assigned to each cell are made of different metals.

13. An apparatus for driving a display panel, the apparatus comprising:
a cell array comprising a plurality of cells coupled to a plurality of gate lines and a plurality of data lines;
a gate driver configured to output gate selection signals to shared gate lines of the plurality of gate lines; and
a data driver configured to output data signals to the cell array via a plurality of data lines,
wherein a first row and a second row of the cell array are configured to share a common gate line of the shared gate lines disposed adjacent to the first row and the second row of the cell array and between the first row and the second row of the cell array,
the gate driver is further configured to simultaneously apply a gate selection signal to cells of the first row and cells of the second row such that the gate selection signal applied to the cells of the first row and the gate selection signal applied to the cells of the second row have a same polarity, and
a number of the plurality of data lines is equal to a number of cells connected to each shared gate line.

14. The apparatus of claim 13, the gate driver comprising a first gate driver and a second gate driver,
wherein the cell array is divided into a plurality of sub-cell arrays, and the first gate driver and the second gate driver are disposed between the plurality of sub-cell arrays.

15. The apparatus of claim 13, wherein at least two of the data lines correspond to each cell of the plurality of cells, and each of the plurality of cells comprises an oxide thin-film transistor (TFT).

16. The apparatus of claim 15, wherein the at least two data lines corresponding to each cell are stacked in a three-dimensional (3D) configuration.

17. A method of driving a display panel, the method comprising:
outputting a gate selection signal via a plurality of shared gate lines, each of the shared gate lines being configured to share the gate selection signal with a corresponding first gate line and a corresponding second gate line; and
outputting data signals to a cell array, each cell of the cell array corresponding to a plurality of data lines, a number of the plurality of data lines being equal to a number of gate lines connected to each of the shared gate lines, and
wherein the gate selection signal is simultaneously applied to cells connected to each of the corresponding first gate line and the corresponding second gate line such that the gate selection signal applied to the corresponding first gate line and the gate selection signal applied to the corresponding second gate line have a same polarity.

18. The method of claim 17, wherein in the outputting of the gate selection signal, the gate selection signal is simultaneously output via the shared gate lines.

19. The method of claim 17, wherein in the outputting of the gate selection signal, the gate selection signal is output by gate selection circuits, and a number of the gate selection circuits is inversely proportional to the number of the shared gate lines.

20. The method of claim 17, wherein at least two gate lines are shared.

21. The method of claim 17, wherein the gate selection signal is applied to a gate electrode of an oxide thin-film transistor (TFT).

* * * * *